United States Patent
Granig et al.

(10) Patent No.: US 9,506,996 B2
(45) Date of Patent: Nov. 29, 2016

(54) APPARATUS AND METHOD FOR DETECTING AN ERROR IN A MEASUREMENT OF A QUANTITY

(71) Applicant: Infineon Technologies AG, Neubiberg (DE)

(72) Inventors: Wolfgang Granig, Seeboden (AT); Harald Witschnig, Landskron (AT); Andrea Morici, Villach (AT)

(73) Assignee: Infineon Technologies AG, Neubiberg (DE)

( * ) Notice: Subject to any disclaimer, the term of this patent is extended or adjusted under 35 U.S.C. 154(b) by 323 days.

(21) Appl. No.: 14/056,627

(22) Filed: Oct. 17, 2013

(65) Prior Publication Data

US 2015/0108971 A1 Apr. 23, 2015

(51) Int. Cl.
*G01R 33/09* (2006.01)
*G01R 33/00* (2006.01)
G01R 35/00 (2006.01)
G01R 17/00 (2006.01)
G01D 5/14 (2006.01)

(52) U.S. Cl.
CPC ......... *G01R 33/091* (2013.01); *G01R 33/0023* (2013.01); *G01R 33/09* (2013.01); *G01D 5/145* (2013.01); *G01R 17/00* (2013.01); *G01R 35/00* (2013.01)

(58) Field of Classification Search
CPC ..................................................... G01R 33/09
USPC .................................................... 324/207.21
See application file for complete search history.

(56) References Cited

U.S. PATENT DOCUMENTS 8,102,175 B2 * 1/2012 Rossler et al. ................. 324/252

2005/0073325 A1 4/2005 Rettig
2008/0012558 A1 1/2008 Rossler et al.
2008/0278158 A1 * 11/2008 Granig et al. ................. 324/247
2010/0060263 A1 * 3/2010 Granig et al. ................. 324/202
2012/0025808 A1 2/2012 Granig et al.

FOREIGN PATENT DOCUMENTS

CN 1754080 A 3/2006

OTHER PUBLICATIONS

Collection and Analysis of Rate Data, University of Michigan, 2007.*
Weighted Least Squares Computations using Stata, Ronald A Thisted, Nov. 1998.*
Bartos et al., "Novel Redundant Magnetoresistive Angle Sensors", Sensiren and Messsysteme 2006, VDE Verlag GmbH, pp. 99-102.

* cited by examiner

*Primary Examiner* — Bot Ledynh
(74) *Attorney, Agent, or Firm* — Schiff Hardin LLP

(57) ABSTRACT

Embodiments relate to an apparatus comprising a first measurement bridge circuit. The first measurement bridge circuit comprises a first half bridge for providing a first half bridge signal in response to a quantity to be measured and a second half bridge for providing a second half bridge signal in response to the quantity. The apparatus further comprises a second measurement bridge circuit. The second measurement bridge circuit comprises a third half bridge for providing a third half bridge signal in response to the quantity and a fourth half bridge for providing a fourth half bridge signal in response to the quantity. The apparatus also comprises an error detector. The error detector is configured to determine an error signal indicative of an error of the measurement of the quantity based on a combination of the first, the second, the third and the fourth half bridge signal.

25 Claims, 12 Drawing Sheets

FIG. 9b

Table 910:

| ADC-Gain | 5.17E-06 µV/LSB | | | | |
|---|---|---|---|---|---|
| | | Element_XLU | Element_XLD | Element_XRU | Element_XRD |
| VDD | 2.5 | R0[Ohm] | R0[Ohm] | R0[Ohm] | R0[Ohm] |
| | | 1000 | 1000 | 1000 | 1000 |
| | | Hub[%] | Hub[%] | Hub[%] | Hub[%] |
| | | 2 | 2 | 2 | 2 |
| Temp. | 2.5 | Reference[°] | Reference[°] | Reference[°] | Reference[°] |
| | | 1 | 180 | 180 | 0 |

Table 920:

| | Element_YLU | Element_YLD | Element_YRU | Element_YRD |
|---|---|---|---|---|
| | R0[Ohm] | R0[Ohm] | R0[Ohm] | R0[Ohm] |
| | 1000 | 1000 | 1000 | 1000 |
| | Hub[%] | Hub[%] | Hub[%] | Hub[%] |
| | 2 | 2 | 2 | 2 |
| | Reference[°] | Reference[°] | Reference[°] | Reference[°] |
| | 90 | 270 | 270 | 90 |

APPARATUS AND METHOD FOR DETECTING AN ERROR IN A MEASUREMENT OF A QUANTITY

TECHNICAL FIELD

Embodiments relate to an apparatus and a method for detecting an error in a measurement of a quantity.

BACKGROUND

Sensor elements are used for multiple purposes in different fields of engineering. Physical quantities measured or sensed by sensors may for example relate to magnetic fields, temperatures, forces, pressure, just to give a few examples. In some cases, sensors or elements thereof may exhibit an electrical resistance that changes its value in reaction to a change of the physical quantity to be measured.

SUMMARY

According to one aspect, embodiments provide an apparatus comprising a first measurement bridge circuit. The first measurement bridge circuit comprises a first half bridge for providing a first half bridge signal in response to a quantity to be measured and a second half bridge for providing a second half bridge signal in response to the quantity. The apparatus further comprises a second measurement bridge circuit. The second measurement bridge circuit comprises a third half bridge for providing a third half bridge signal in response to the quantity and a fourth half bridge for providing a fourth half bridge signal in response to the quantity. The apparatus also comprises an error detector. The error detector is configured to determine an error signal indicative of an error of the measurement of the quantity based on a combination of the first, the second, the third and the fourth half bridge signal.

According to another aspect, embodiments provide an apparatus for detecting an error in a measurement of a physical quantity. The physical quantity is measured via a first Wheatstone bridge and a second Wheatstone bridge. The first Wheatstone bridge includes a first half bridge. The first half bridge provides a first half bridge signal in response to the measured physical quantity. The first Wheatstone bridge also includes a second half bridge. The second half bridge provides a second half bridge signal in response to the measured physical quantity. The second Wheatstone bridge includes a third half bridge. The third half bridge provides a third half bridge signal response to the measured physical quantity. The second Wheatstone bridge includes a fourth half bridge. The fourth half bridge provides a fourth half bridge signal response to the measured physical quantity. The apparatus also includes an error detector to determine the error based on a weighted sum of the first, the second, the third and the fourth half bridge signal.

Moreover, embodiments provide a method for detecting an error in a measurement of a quantity. The method comprises a providing, from a first measurement bridge circuit measuring the quantity, a first half bridge signal and a second half bridge signal. The method further comprises a providing, from a second measurement bridge circuit measuring the quantity, a third half bridge signal and a fourth half bridge signal. The method also comprises a determining of an error signal indicative of the error based on a combination of the first, the second, the third and the fourth half bridge signal.

BRIEF DESCRIPTION OF THE FIGURES

Some embodiments of apparatuses and/or methods will be described in the following by way of example only, and with reference to the accompanying figures, in which:

FIG. 9b shows two tables with test datasets for magnetoresistive elements comprised by the two bridge circuits shown in FIG. 9a;

DESCRIPTION OF EMBODIMENTS

Figure 1:
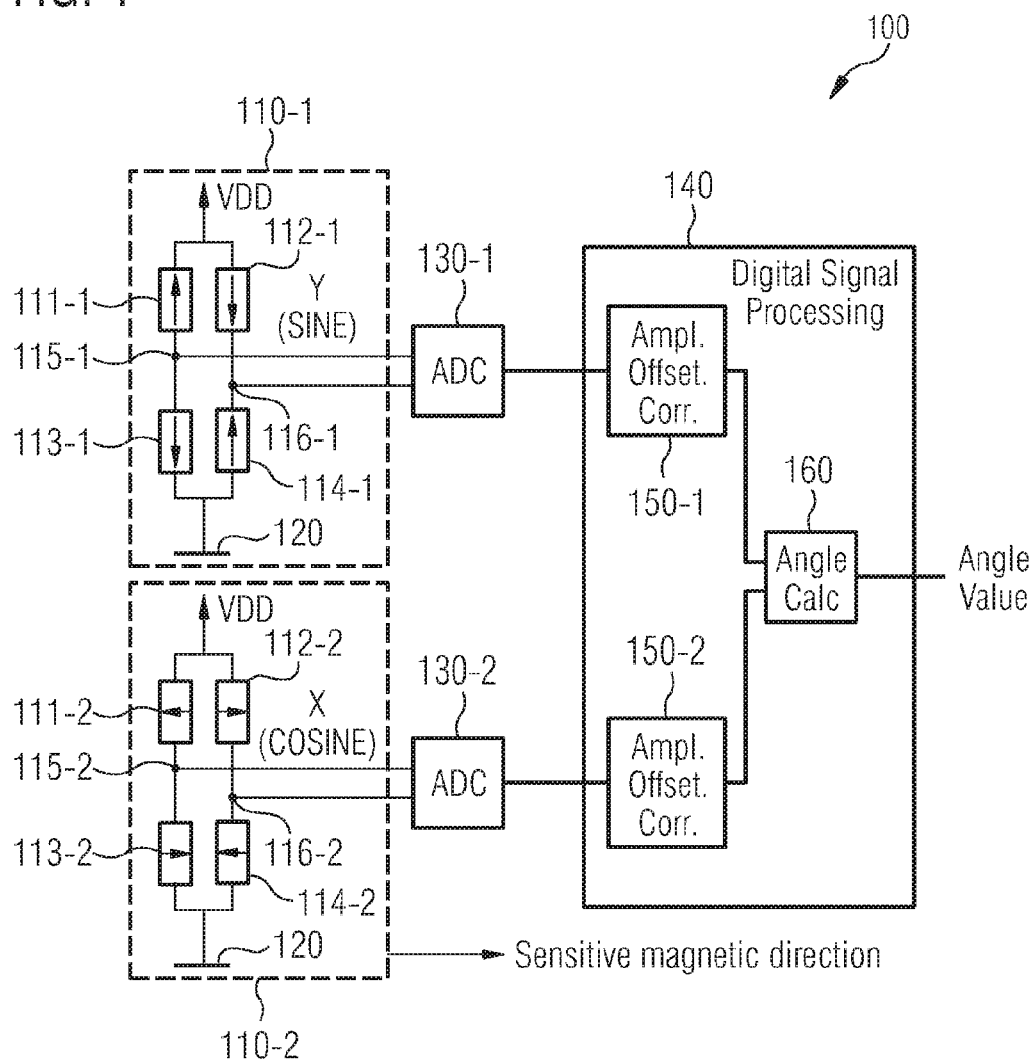
FIG. 1 shows a block diagram of an angle sensor system featuring two bridge circuits.

Various example embodiments will now be described more fully with reference to the accompanying drawings in which some example embodiments are illustrated. In the figures, the thicknesses of lines, layers and/or regions may be exaggerated for clarity.

Accordingly, while example embodiments are capable of various modifications and alternative forms, embodiments thereof are shown by way of example in the figures and will herein be described in detail. It should be understood, however, that there is no intent to limit example embodiments to the particular forms disclosed, but on the contrary, example embodiments are to cover all modifications, equivalents, and alternatives falling within the scope of the invention. Like numbers refer to like or similar elements throughout the description of the figures.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (for example, "between" versus "directly between," "adjacent" versus "directly adjacent," etc.).

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof.

Unless otherwise defined, all terms (including technical and scientific terms) used herein have the same meaning as commonly understood by one of ordinary skill in the art to which example embodiments belong. It will be further understood that terms, for example, those defined in commonly used dictionaries, should be interpreted as having a meaning that is consistent with their meaning in the context of the relevant art and will not be interpreted in an idealized or overly formal sense unless expressly so defined herein.

Some sensor elements may for instance be based on a magneto-resistive effect having an influence on their resistivity. Magneto-resistive effects include a number of different physical phenomena, all of which having in common that an electrical resistance of a resistive element is alterable by the behavior of a magnetic field penetrating the resistive element. Technologies utilizing magneto-resistive effects are sometimes referred to as "XMR technologies", whereby the X indicates that a multitude of magneto-resistive effects may be addressed here.

One example of an XMR-effect is the Anisotropic Magneto-Resistive (AMR) effect, which is based on the fact that in a conductive layer the electrical resistance may be changed by altering an angle between an external magnetic field and a direction of an electric current within the layer plane. The effect may be explained by a distortion of atomic orbitals due to spin orientation in a magnetic field and hence different scattering cross sections of conducting electrons.

Another example is the Giant Magneto-Resistive (GMR) effect, which may occur in a layer stack of layers comprising at least two ferromagnetic layers separated by a non-ferromagnetic layer. If both ferromagnetic layers are magnetized the electrical resistance of the layer stack may be altered by changing the angle between the magnetization directions of the ferromagnetic layers, whereby the effect results from electron scattering depending on spin orientation of the electrons. The different magnetization directions may be achieved by pinning one ferromagnetic layer (pinned layer) to a reference magnetization, whereas the magnetization of the other ferromagnetic layer (free layer) may depend on an external magnetic field.

Yet another example is the Tunnel Magneto-Resistive (TMR) effect, which may occur in a layer stack of (nanometer-) thin layers comprising at least two ferromagnetic layers separated by an electrically isolating layer. If both ferromagnetic layers are magnetized the electrical resistance of the layer stack may be altered by changing the angle between the magnetization directions of the ferromagnetic layers, whereby the effect results from tunneling probability depending on the orientations of electron spin and of the magnetic fields. Again, the different magnetization directions may be achieved by pinning one ferromagnetic layer (pinned layer) to a reference magnetization, whereas the magnetization of the other ferromagnetic layer (free layer) may depend on an external magnetic field.

Other sensor elements may experience a variation of their resistivity due to mechanical stresses, like pressure or drag forces, or changes in temperature. For example, strain gauges which may have a thin, elongated metal stripe may represent one example, where the resistivity of the stripe may vary as the dimensions of the stripe change in reaction to a variation of a physical quantity to be measured.

The aforementioned XMR effects, for instance, may be applied in a variety of field based sensors, for example, for measuring revolution, angles, etc. Sensors with gauges, like strain gauges or piezo-resistors, may for example be used for measuring the strain of an object caused by mechanical or thermal influence. In some applications, especially in applications relevant to safety, it may be required that these sensors operate reliably and at a high level of accuracy.

FIG. 1 shows a block diagram of an angle sensor system 100. For example, the system 100 may be based on XMR technology, which is indicated in FIG. 1. However, other sensor technologies are also possible.

The angle sensor system 100 comprises a first measurement bridge circuit 110-1 and a second measurement bridge circuit 110-2. As can be seen the first measurement bridge circuit 110-1 and the first measurement bridge circuit 110-1 are arranged as Wheatstone bridges, respectively. However, other bridge circuit arrangements, such as Wien bridges, Maxwell bridges, or the like, are also conceivable. The first and the second measurement bridge circuit 110-1, 110-2 in FIG. 1 each comprise an XMR resistor 111-1, 111-2 connected to a supply voltage VDD and a node 115-1; 115-2, and an XMR resistor 112-1, 112-2 connected to the supply voltage VDD and a node 116-1; 116-2. Further, an XMR resistor 113-1, 113-2 is connected to the node 115-1, 115-2 and to ground 120. An XMR resistor 114-1; 114-2 is connected to the node 116-1; 116-2 and to ground 120. Note that also other variable resistive sensor elements, such as strain gauges or the like, are possible.

The XMR resistors 111-1 and 113-1 thereby form a first half bridge circuit of the first measurement bridge circuit 110-1, leading to a first half bridge signal at node 115-1. The XMR resistors 112-1 and 114-1 form a second half bridge circuit of the first measurement bridge circuit 110-1, leading to a second half bridge signal at node 116-1. A difference of the first and the second half bridge signal leads to a full bridge signal Y of the first measurement bridge circuit 110-1. Likewise, the XMR resistors 111-2 and 113-2 form a third half bridge circuit of the second measurement bridge circuit 110-2, leading to a third half bridge signal at node 115-2. The XMR resistors 112-2 and 114-2 form a fourth half bridge circuit of the second measurement bridge circuit 110-2, leading to a fourth half bridge signal at node 116-2. A difference of the third and the fourth half bridge signal leads to a full bridge signal X of the second measurement bridge circuit 110-2.

As can be seen from FIG. 1, reference magnetizations of corresponding XMR resistors, which may be GMR elements, for example, of the first and the second measurement bridge circuit 110-1, 110-2 deviate by essentially 90°. For example, the reference magnetization of XMR resistor 111-1 is tilted against the reference magnetization of corresponding XMR resistor 111-2 by a tilt angle of essentially 90°. This also holds for other pairs of first and second XMR resistors of the first and second measurement bridge circuit. The mentioned difference of reference magnetizations in return leads to a phase offset of also essentially 90° between the respective full bridge signals of the first and second measurement bridge circuits 110-1, 110-2. Hence, the full bridge signal Y of the first measurement bridge circuit 110-1 may be interpreted as a sine-component of a measurement signal, while the full bridge signal X of the second measurement bridge circuit 110-2 may be interpreted as a cosine-component of the measurement signal for measuring an angle of an external magnetic field with respect to a reference orientation.

The sine-like full bridge signal Y may be sensed between the node 115-1 and the node 116-1 and the cosine-like full bridge signal X may be sensed between the node 115-2 and the node 116-2. After passing an Analog-to-Digital Converter (ADC) 130-1; 130-2, the sine-like and cosine-like full bridge signals Y, X may be made available to a digital signal processor 140. The digital signal processor 140 may perform an amplitude offset correction 150-1, 150-2 of the sine and cosine signals Y, X, respectively.

The amplitude-corrected sine and cosine signals Y, X may be used to perform an angle calculation 190 with the digital signal processor 140, in order to obtain an angle value indicative of an orientation of an external magnetic field measured by the angle sensor system 100. However, the angle sensor system 100 does not provide redundant information related to the angle value, which may in some cases pose a safety risk.

There are some concepts providing redundancy concepts featuring two independent sensors, which are expensive in terms of production effort and cost. Other solutions further comprise safety algorithms that have only limited capability, resulting in unrecognized errors. As a result, the prices for sensors significantly increase with their reliability. It is hence desirable to improve a redundancy concept for error detection in a measurement of a quantity and, in doing so, increasing reliability and accuracy while keeping production effort and cost low.

Functional Safety may represent a clear differentiator for current and future products, for example in Automotive. To achieve corresponding targets in terms of Automotive Safety Integrity Level (ASIL) new and enhanced concepts may be established. To achieve a dedicated ASIL level different target parameters as Failures In Time (FIT) rate, Diagnostic Coverage (DC), Single Point Fold Matrix (SPFM), Latent Point Fold Matrix (LPFM), etc. have to achieve a dedicated value. Such a value may be for example 90 percent, indicating a probability of 90% that a given error is recognized as such. DC, SPFM and LPFM each yield a value given in percent, whereby the respective methods of calculation differ from each other. A key element to achieve these values may be "intelligent" redundancy and diversity. A pure doubling of circuit blocks may represent an approach which, however, may lead to significant cost enhancements and may therefore not be suitable or inefficient.

For angle sensors, for example, a typical safety goal may be to guarantee a defined angle accuracy value in a predefined time, for example 5° deviation of a true angle value has to be detected in 5 milliseconds (ms). A problem to be overcome in that context may simply be how to guarantee validity of a detected value by avoiding usage of a second sense element.

The problem of achieving ASIL-related targets may be solved by providing fully independent sensors. Such sensors are comprised by separate integrated circuits and which have been manufactured independently from each other. This architecture may allow fulfilling the expected target values (for example diagnostic coverage of more than 90%) but it may represent an expensive scenario to achieve this goal.

Figure 2:
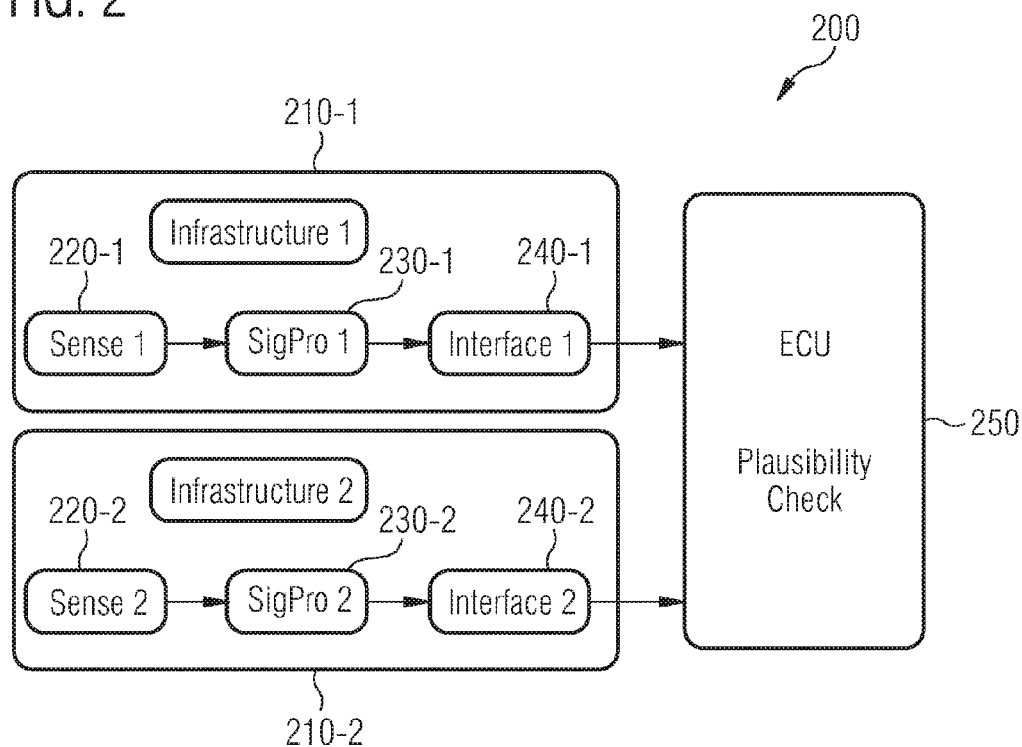
FIG. 2 depicts a flow chart illustrating an architecture featuring two fully independent sensors.

FIG. 2 depicts a flow chart illustrating a sensor or measurement architecture 200 featuring two fully independent sensors. Each separate Integrated Circuit (IC) 210-1, 210-2, comprises a sensor 220-1, 220-2 to detect a measurement value and, in response, to cause a signal, a processor 230-1, 230-2 to process the signal, wherein the processor 230-1, 230-2 may for example be an Analog-to-Digital Converter (ADC) or an amplifier, and an interface 240-1, 240-2 to provide the processed signal to an Electronic Control Unit (ECU) 250. The sensor or measurement architecture 200 exhibits two separate integrated circuits 210-1, 210-2 which may have been produced or manufactured completely independently from each other.

The processed signals may be received by the ECU 250, which may perform a plausibility check. The plausibility check may for example comprise a comparison of the processed signals or an evaluation if a ratio between the two signals is within a previously given range of values. However, a setup of two separate sensing infrastructures may be costly and require substantial production effort. The architecture 200 may further use up a large portion of available installation space, which might for example be problematic in terms of electromagnetic compatibility when employed in an automobile or vehicle, where large amounts of electronic components are packed in a comparatively small volume. In other words, a pure doubling of circuit blocks may represent a possibility which, may lead to significant cost enhancements and may therefore not be suitable or inefficient.

Furthermore, another signal processing and safety mechanism may be introduced. Dedicated Safety mechanisms may aim to detect deviations from an expected sensor signal that might result from different kinds of errors in the analog or digital part of the IC. Another example to identify deviations from a real angle value might be a vector length check. Assuming an angle value, which, in case of a usage of GMR sensors, may be given by a cosine signal X and a sine signal Y, the signals X and Y ideally, or, in other words, in the absence of errors, fulfill the Equation of the Circle $X^2+Y^2=A^2$ for every angle in a 0°-360° range. The value A is a radius of a circle, the radius corresponding to a maximum possible amplitude of X and Y, and its absolute value representing the length of the vector to be checked. Calculation of a vector length may be done by adding squares of the first and the second signal values, respectively, and extracting the square root of the sum.

Figure 3:
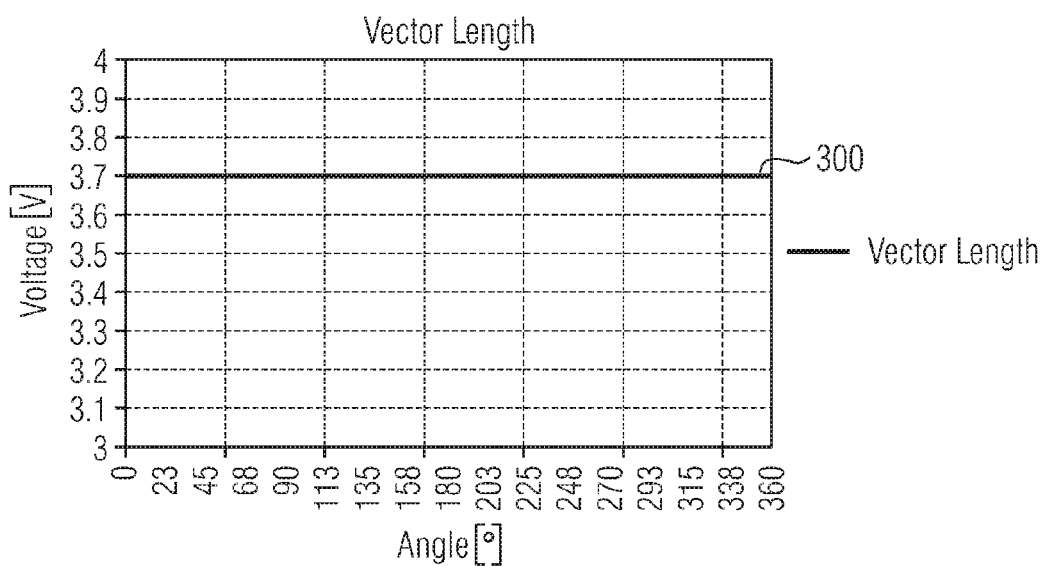
FIG. 3 depicts a diagram showing an evaluation of a vector length.

FIG. 3 shows an evaluation of the vector length A according to a solution, where the calculated vector length A is expressed in terms of a voltage, as the signals X and Y may be measured in Volts (V). The voltage in V is shown on the y-axis, and a measured angle in degrees (°) is shown on the x-axis. Ideally, the vector length A is a constant function 300 in terms of the measured angle, as can be seen from FIG. 3. Errors in the IC may lead to an offset in the X or Y signals, and therefore to a deviation of A from this constant value. This may indicate a deviation in terms of angle.

Figure 4:
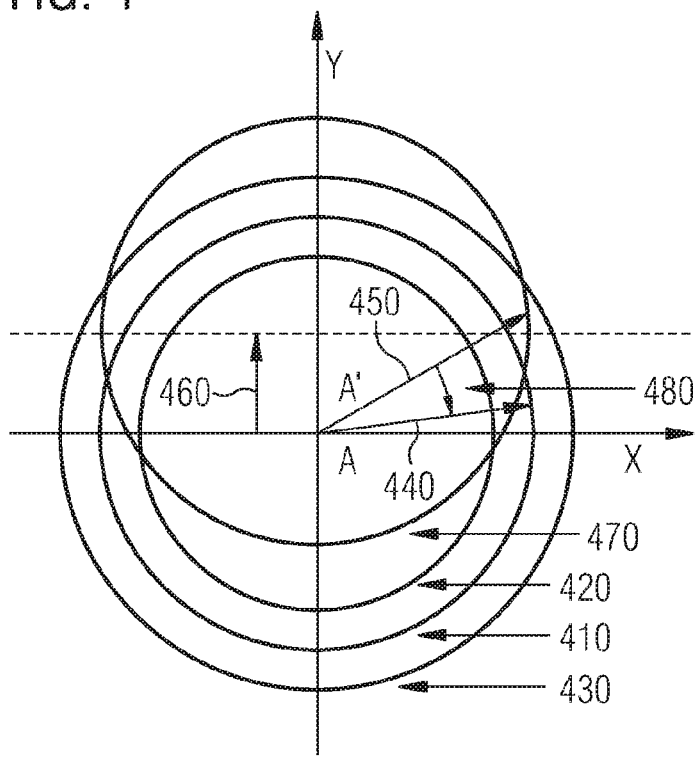
FIG. 4 depicts a graphic showing an evaluation of a vector length.

FIG. 4 visualizes the aforementioned vector length check. Ideally, the two sinusoidal signals X and Y are phase-shifted to each other by 90° and hence the sum of the square of their values for a given angle corresponds to a square of a vector length. In other words, X and Y ideally are in a mutual relationship for all angles, which fulfills the Equation of the Circle $X^2+Y^2=A^2$, where A is the radius of the circle.

FIG. 4 shows a Cartesian grid with an X-axis and a Y-axis, where a central circle 410 displays the ideal case of error-free signals X and Y over a 360° range. An inner circle 420 and an outer circle 430 mark the limits for the vector length, within which the signals X and Y are not recognized as erroneous. An exemplary vector 440 with length A calculated from two error-free signals X and Y is shown in FIG. 4.

A further vector 450 is shown to represent a situation in which the X signal is kept, but the Y signal is subject to an offset 460. The offset 460 in Y may be described mathematically by a shift parameter in the Equation of the Circle, which, for the new possible values of Y, results in an eccentric circle 470. Accordingly, the further vector 450 for the X and Y signals may, for some angular values, lie within the vector length limits, or outside for other angular values. In FIG. 4, although the further vector 450 exhibits a length A' which is still within the allowed boundaries, the vector 440 and the further vector 450 are pointing into different directions. This difference in directions may be indicated by an error angle 480, by which a measured angle value calculated from faulty X or Y signals may deviate from an actual angle value. In other words, the detection range of offset errors may correspond to the section of the eccentric circle 470 lying outside the limits for the vector length (circles 420 and 430), if the detection is performed by a minimum/maximum vector length check.

As explained in FIGS. 3 and 4, errors in the IC may lead to a deviation of this constant value and may therefore represent an indication for a deviation in terms of angle. Nevertheless the capabilities of these signal processing mechanisms may not be fully given for every application scenario. To detect deviations with high probability, for example at least 90%, a rotation of the magnet/application may be necessary, because regions may exist where the vector length is within predefined limits, but the angle error is already larger than allowed. This case is exemplified in FIG. 4, where a rotation may be necessary to recognize the further vector 450, and hence the signals X or Y as erroneous. In many situations, however, the rotation of the magnet/application may not be feasible.

Furthermore, some errors might be identified by range checks (for example ADC overflow, digital data path overflow checks). In general these mechanisms may have a low diagnostic coverage and may not contribute significantly to achieve the final aim.

To overcome such and other problems, some example embodiments related to an apparatus and a method for detecting an error in a measurement of a quantity are presented in the following.

Figure 5A:
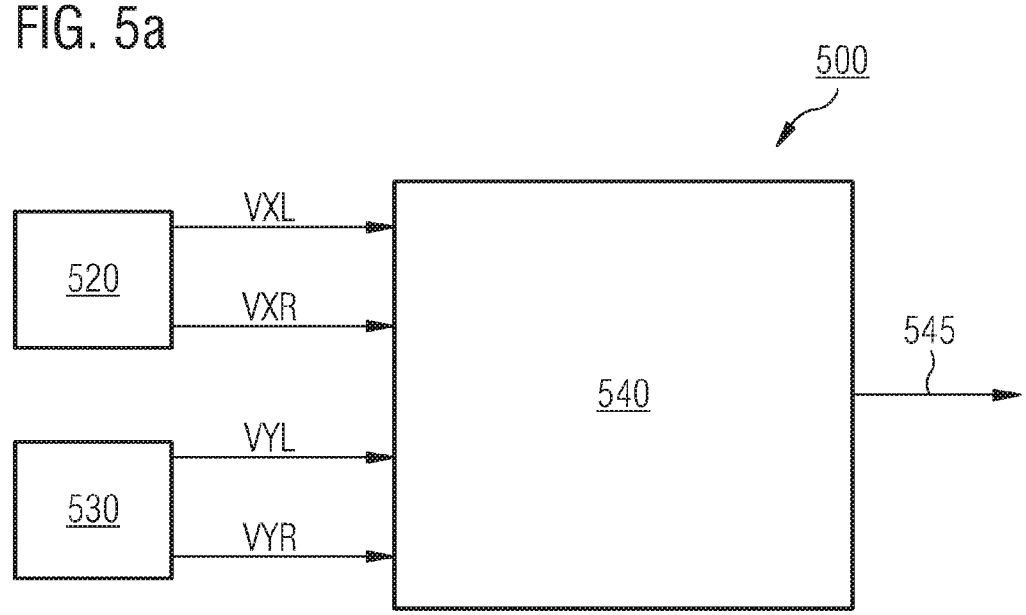
FIG. 5a illustrates a sensor for measuring a quantity coupled to an embodiment of an apparatus for detecting an error in the measurement of the quantity.

FIG. 5a shows an embodiment of an error detection apparatus 500.

The apparatus 500 is to detect an error in a measurement of a quantity. The quantity is measured via a first measurement bridge circuit 520 and a second measurement bridge circuit 530. The first measurement bridge circuit 530 comprises a first half bridge for providing a first half bridge signal VXL in response to the quantity and a second half bridge for providing a second half bridge signal VXR in response to the quantity. The second measurement bridge circuit comprises a third half bridge to provide a third half bridge signal VYL in response to the quantity and a fourth half bridge to provide a fourth half bridge signal VYR in response to the quantity. Further, the apparatus comprises an error detector 540 to determine an error signal 545 which is indicative of the error. The error signal 545 is based on a combination of the first, the second, the third and the fourth half bridge signal.

The measured quantity may be a physical or environmental quantity, such as a temperature, a force or an angular orientation of a magnetic field, for example. The measurement bridge circuits 520; 530 may be any measurement bridge circuits, such as Wheatstone bridges, Maxwell bridges, Wien bridges, etc. Also, variable resistive elements used in the measurement bridge circuits 520; 530 may be of any kind, such as strain gauges, XMR elements, etc.

Figure 5B:
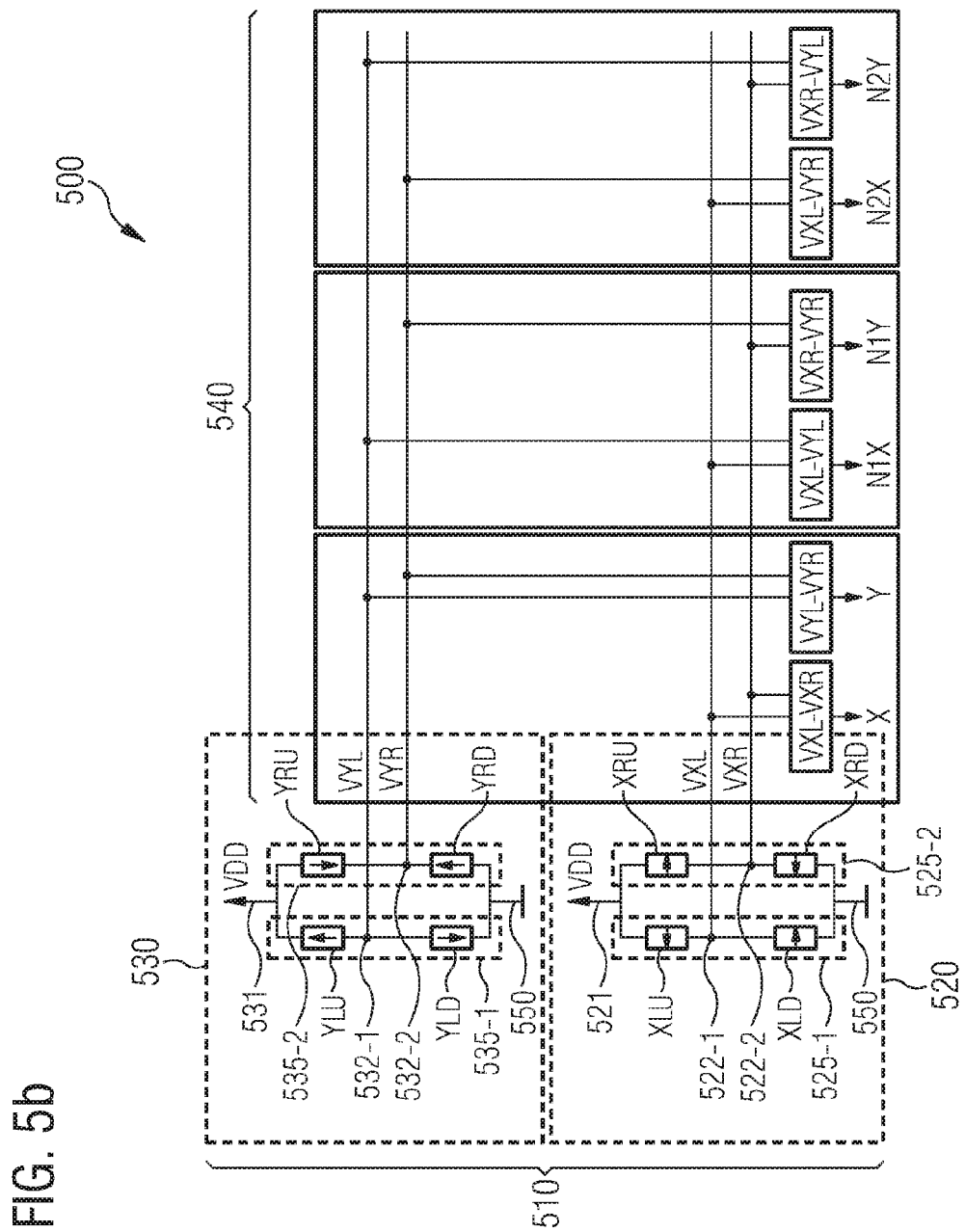
FIG. 5b illustrates a sensor for measuring a quantity coupled to a further embodiment of an apparatus for detecting an error in the measurement of the quantity.

In the exemplary implementation illustrated in FIG. 5b an error detection apparatus 500 is connected or coupled to a sensor unit 510. The sensor unit 510 comprises a first measurement bridge circuit 520 and a second measurement bridge circuit 530. Here, the setup of the first measurement bridge circuit 520 and the second measurement bridge circuit 530 correspond for example to the first Wheatstone bridge circuit 110-1 and the second Wheatstone bridge circuit 110-2 of FIG. 1, respectively. Hence, the physical quantity, which may be an angular orientation of an external magnetic field, for example, is measured using both the first measurement bridge circuit 520 and the second measurement bridge circuit 530.

The error detection apparatus 500 of FIG. 5b comprises a first interface to the first measurement bridge circuit 520. The first measurement bridge circuit 520 comprises a first half bridge 525-1 to provide a first half bridge signal VXL to the first interface in response to the measured quantity and a second half bridge 525-2 to provide a second half bridge signal VXR to the first interface in response to the measured quantity. The example error detection apparatus 500 further comprises a second interface to the second measurement bridge circuit 530. The second measurement bridge circuit 530 comprises a third half bridge 535-1 for providing a third half bridge signal VYL to the second interface in response to the measured quantity and a fourth half bridge 535-2 for providing a fourth half bridge signal VYR to the second interface in response to the measured quantity. Further, the error detection apparatus 500 comprises an error detector 540 coupled to the first and the second interface, thus coupled to the first and second measurement bridge circuit 520; 530. The error detector 540 is configured to determine an error signal indicative of the error based on a combination of the first, the second, the third, and the fourth half bridge signals VXL; VXR; VYL; VYR.

In some embodiments the apparatus 500 may comprise circuitry to provide at least two different combinations of the first, second, third and fourth half bridge signals VXL; VXR; VYL; VYR to the error detector 540. Different combinations of the four half bridge signals VXL; VXR; VYL; VYR may be used to create measurement error information, which may serve for a safety check. The error detector 540 may for example include a processor like a microcontroller, a Central Processing Unit (CPU), a Digital Signal Processor (DSP) or otherwise programmable hardware component. An analog or digital signal from the measurement bridge circuits 520; 530 may correspond for example to an electric voltage. The first, second, third and fourth half bridge signals may be continuous, discrete, or a combination thereof. The first, second, third and fourth half bridge signals may be analog or digital signals.

Combinations of the first, the second, the third, and the fourth half bridge signals VXL; VXR; VYL; VYR may in some embodiments include a first combination of differential signals from a first group of differential signals and a second combination of differential signals from a second group of differential signals. The first group of differential signals may correspond to a first selection of differential signals from the first, second, third and fourth half bridge signals. The second group of differential signals may correspond to a second selection of differential signals from the first, second, third and fourth half bridge signals. The first selection may be different from the second selection.

In some further embodiments at least one of the first group of differential signals or second group of differential signals includes a differential signal formed from at least one of the first and second half bridge signals and at least one of the third and fourth half bridge signals. For example the combination (VYL−VXL) represents a differential signal formed from the first and the third half bridge signal. In other words, at least one of the differential signals may be formed by a combination of half bridge signals provided by different measurement bridges.

As can be seen from FIG. 5b, the first and the second measurement bridge 520; 530, henceforth also referred to as first and the second "full bridge", each comprise a parallel connection of two half bridges 525-1; 525-2 and 535-1; 535-2. The latter will also be referred to as "left" half bridge 525-1; 535-1 and "right" half bridge 525-2; 535-2 in the further explanation of FIG. 5. In practice however, the left half bridge 525-1; 535-1 and the right half bridge 525-2; 535-2 may be mutually exchangeable.

In some embodiments the apparatus 500 may be configured to detect an error in the measurement of an orientation of an external magnetic field with respect to some reference orientation. Hence, the first full bridge 520 and the second full bridge 530 in the example embodiment of FIG. 5b comprise a multitude of magneto-resistive sensor elements. Thereby a magneto resistive sensor element may utilize any magneto-resistive (XMR) effect such as for example Giant Magneto-Resistance (GMR), Tunnel Magneto-Resistance (TMR), Colossal Magneto-Resistance (CMR) or Anisotropic Magneto-Resistance (AMR). Hence, according to some embodiments the sensor unit 510 may be operable to measure the physical quantity based on an XMR technology. Thus, one or more resistive elements of the first and the second measurement bridge circuit 520; 530 may be magneto-resistive elements. An XMR element may often comprise a multitude of ferromagnetic and non-ferromagnetic layers in a common layer stack. Some XMR phenomena, such as GMR or TMR may occur in XMR elements having a reference magnetization in a ferromagnetic layer. The reference magnetization may for example be pinned by an antiferromagnetic layer adjacent to said ferromagnetic layer.

It shall be understood that the embodiment of FIG. 5b is merely an example. In practice, applications may not be limited to measurement of magnetic fields. Beyond that, further embodiments may relate to a measurement of any other physical quantity, for example temperature, a mechanical force, velocity, brightness, radiation, etc. Consequently, other embodiments also relate to other sensor elements, for example, to sensor elements making use of variable resistors in the bridge circuits in form of strain gauges or the like.

Each half bridge 525-1; 525-2; 535-1; 535-2 illustrated in FIG. 5b comprises an XMR resistor (denoted herein as an "upper" XMR resistor) connected to a respective voltage supply port 521; 531 and a circuit node 522-1; 522-2; 532-1; 532-2, and an XMR resistor (denoted herein as a "lower" XMR resistor) connected to the node 522-1; 522-2; 532-1; 532-2 and to ground 550. A combination of three letters indicates the location of each XMR resistor. Combinations beginning with "Y" and "X" denote the first measurement bridge circuit 520 and the second measurement bridge circuit 530, respectively, "L" and "R" denote the left and the right half bridge, respectively, and "U" and "D" denote the upper and the lower XMR resistor, respectively. Hence, for example "XLU" denotes the upper left XMR resistor of the first measurement bridge circuit 520. A supply voltage VDD is further applied to the voltage supply ports 521; 531.

The XMR resistors shown in FIG. 5b each have a reference magnetization or reference orientation. Orientations of the respective reference magnetizations are schematically indicated by arrows. An electrical resistance of an XMR resistor may change in response to the strength or the orientation of an external magnetic field applied to the XMR resistor. For example, electrical resistance in GMR and TMR resistors may be highest if their reference magnetization and the external magnetic field are in an anti-parallel orientation, and lowest if the reference magnetization and the external magnetic field are in a parallel orientation. As can be seen from FIG. 5b, the upper XMR resistors of the full bridges 520; 530 may have reference magnetizations aligned anti-parallel to each other, respectively, and the lower XMR resistors of the full bridges 520; 530 have reference magnetizations aligned anti-parallel to each other, respectively.

As has been described already with reference to FIG. 1, the reference magnetization of a first magneto-resistive element XLU (XRU, XLD, XRD) of the first full bridge 520 may be tilted against a reference magnetization of a corresponding second magneto-resistive element YLU (YRU; YLD; YRD) of the second full bridge 530 by a tilt angle of essentially 90°. Applying an external magnetic field may hence result in a multitude of distinct half bridge signals suitable for a unique determination of an orientation angle of the external magnetic field or for an error diagnostics If an angular orientation of an external magnetic field applied to the sensor unit 510 changes relative to the reference magnetization of one or more of the XMR resistors, the respective XMR resistor shows a reaction by a change of its electrical resistance. In embodiments the sensors of both full bridges 520; 530 are operable to measure the same physical quantity, which may be the orientation of the external magnetic field.

If a voltage VDD is applied to the voltage supply ports 521, 531, the half bridge signals VXL, VXR, VYL, and VYR may be sensed at the nodes 522-1, 522-2, 532-1, 532-2 of the half bridges 525-1, 525-2, 535-1, 535-2, respectively. A difference between the half bridge signal VXL and the half bridge signal VXR of the first full bridge 520 yields a full bridge signal X:

$$X = VXL - VXR,$$

and a difference between the half bridge signal VYL and the half bridge signal VYR of the second full bridge 530 yields a full bridge signal Y:

$$Y = VYL - VYR,$$

which is schematically depicted in FIG. 5b. Hence, the first bridge circuit 520 of the sensor unit 510 may be configured to provide a first full bridge signal X in response to the physical quantity applied to the sensor unit 510. The second bridge circuit 530 of the sensor unit 510 may be configured to provide a second full bridge signal Y in response to said physical quantity. Due to the mentioned relations of reference magnetizations between magneto-resistive elements of the first full bridge 520 and magneto-resistive elements of the second full bridge 530, a phase difference between the first and the second full bridge signal X; Y may thereby be in range of 90°±10°.

The example embodiment of FIG. 5b relates to a sensor unit 510 comprising XMR sensors with individual reference magnetizations. The orientations of the respective reference magnetizations of the XMR resistors, as described above, may represent one possibility to reach a net effect of a cosine-shaped full bridge signal X, and a sine-shaped signal Y. The full bridge signals X and Y may thus be signals shifted by 90° in phase. The phase shift of 90° however represents an ideal case; in some embodiments, deviations from 90° of up to 1°, 5° or 10° may occur. By said phase shift, a measured orientation angle of an external magnetic field may be determined uniquely over a range of 360°. In other embodiments, phase differences other than 90°, for example 45° may be possible, which may however put constraints on some principles presented later to detect an error in the measurement of the quantity.

Figure 6:
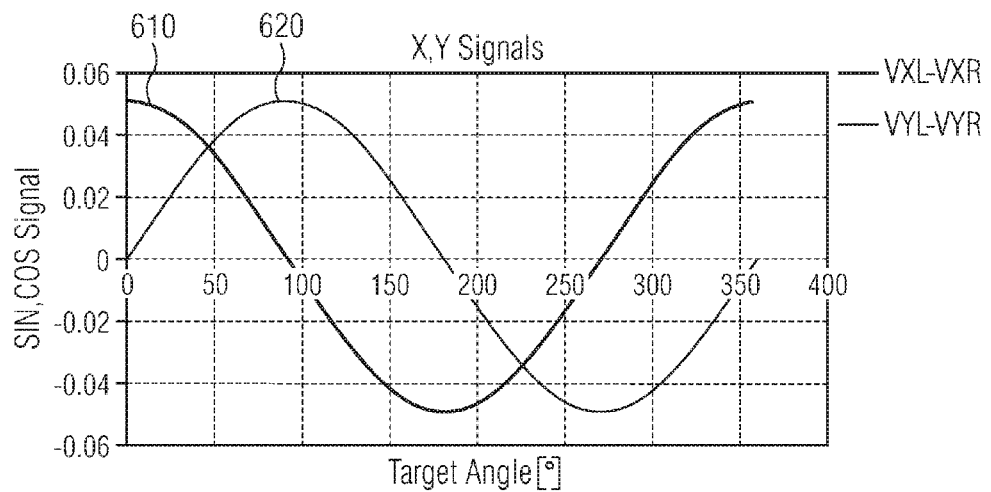
FIG. 6 depicts a diagram showing the behavior of two full bridge signals in dependence of an angle.

In order to explain how to determine the magnetic field orientation angle uniquely, an example for the full bridge signals X=VXL−VXR and Y=VYL−VYR is displayed in FIG. 6, where the signals correspond to an electrical voltage between nodes 522-1, 522-2 and 532-1, 532-2, respectively. The signal strength in Volts (V) is plotted on the y-axis, and an orientation angle of an external magnetic field (target angle) in degrees (°) is plotted on the x-axis. A graph 610 indicates the full bridge signal X, and a graph 620 indicates the full bridge signal Y. The signals X and Y are ideally sinusoidal and periodic over a 360° range and have respective example amplitudes of 50 mV. FIG. 6 represents an ideal case where signals X and Y are not subject to measurement errors, for example due to deficient XMR sensors.

Due to their sinusoidal appearance with a period of 360°, each full bridge signal X and Y yields two possible angle values for any one voltage value, except for the maximum and minimum voltage values. In other words, for example the full bridge signal X, taken on its own, may yield ambiguous information. This ambiguity can be solved by taking into account the second full bridge signal Y, which is ideally shifted by 90°, since any occurring pair of X and Y values may hence be assigned to a unique angle value.

In some embodiments, such as the one shown in FIG. 5b, the apparatus 500 or the error detector 540 thereof may be configured to provide the first differential signal N1X or N2X in response to an external magnetic field applied to the sensor unit 510. The apparatus 500 or the error detector 540 thereof may further be configured to provide the second differential signal N2X or N2Y in response to said external magnetic field. A phase difference between the first and the second differential signal may further be in range of 180°±10°. The phase shift of 180° however may represent an ideal case; in some embodiments, deviations from 180° of up to 1°, 5° or 10° may occur. It may hence be possible to obtain an actual value of an error signal corresponding to a sum of the first and the second differential signal for comparison with a reference value or an ideal value in order to infer presence of an error. The error detector 540 may hence be configured to compare the error signal against a predefined limit, and to indicate the error if the error signal exceeds the predefined limit.

In some embodiments the error detector 540 may be configured to subtract the four half bridge signals VXL, VXR, VYL, VYR from one another such that a minuend is provided by the first full bridge 520, and a subtrahend is provided by the second full bridge 530. This way, four differential signals $$N1X=VXL-VYL,$$

$$N1Y=VXR-VYR,$$

$$N2X=VXL-VYR,$$

$$N2Y=VXR-VYL,$$

may be obtained. The differential signals N1X, N1Y, N2X, and N2Y may hence be obtained by forming a difference of half bridge signals coming from different full bridge circuits, respectively. In other embodiments the minuend may be provided by the second full bridge 530, and the subtrahend may be provided by the first full bridge 520, which causes the signs of the differential signals N1X; N1Y; N2X; N2Y to switch.

In other words, embodiments in general may solve problems of sensors relating to reliability and accuracy by using different combinations of the half bridge signals VXL, VXR, VYL, VYR for diagnostic purposes. Conventionally, to obtain the full bridge signal X, the left half bridge signal VXL may be measured against the right half bridge signal VXR differentially. The same may be done with VYL and VYR to obtain the full bridge signal Y. Determining further combinations of the half bridge signals VXL, VXR, VYL, VYR may lead to additional information which may be used for error and, hence, safety checks. According to some embodiments the half bridge signals VXL, VXR, VYL, and VYR may thus be combined in order to get the additional measurement signals N1X, N2X, N1Y, and N2Y for plausibility checks.

Figure 7:
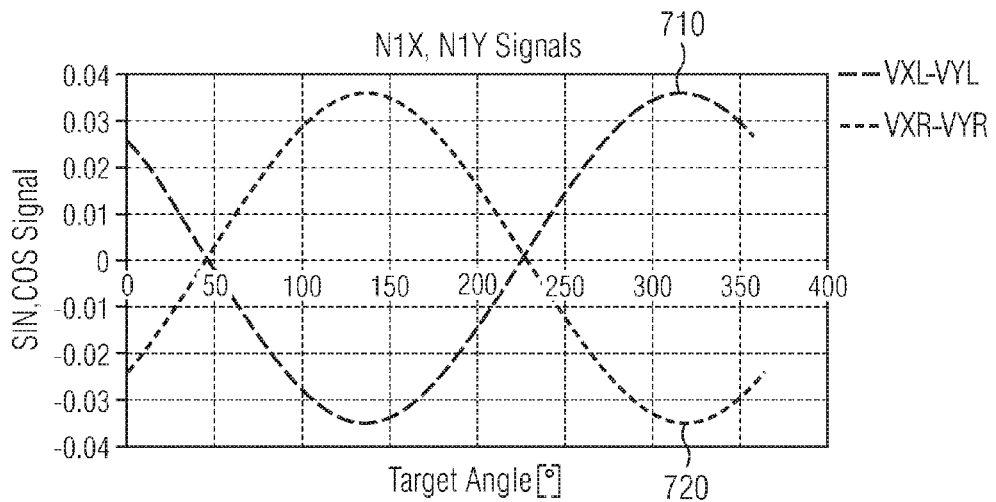
FIG. 7 depicts a diagram showing the behavior of two differential signals in dependence of an angle.
Figure 8:
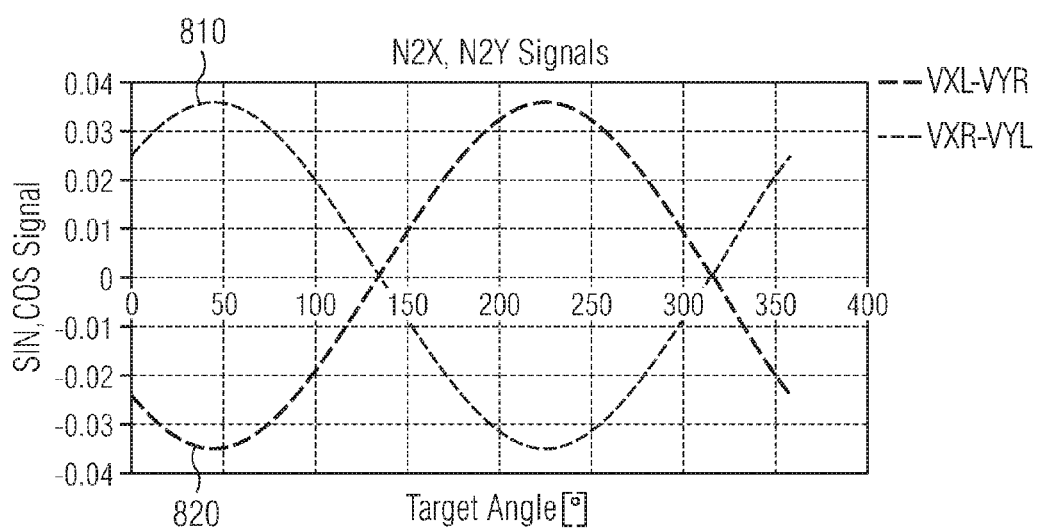
FIG. 8 depicts a diagram showing the behavior of two more differential signals in dependence of an angle.

In FIGS. 7 and 8, a signal strength in V is plotted versus an angle in degrees [°]. Graph 710 corresponds to signal N1X, and graph 720 corresponds to signal N2X in FIG. 7. Graph 810 corresponds to signal N1Y, and graph 820 corresponds to signal N2Y in FIG. 8. The differential signals, or the differences, N1X, N1Y, N2X, and N2Y are calculated as described above. All four signals have a sinusoidal appearance with respective amplitudes of about 35 mV. Ideally, the differential signal N1X is phase-shifted by 180° with respect to the differential signal N1Y. Ideally, the differential signal N2X is phase-shifted by 180° with respect to the differential signal N2Y. FIGS. 7 and 8 represent an ideal case where the differential signals N1X, N1Y, N2X, and N2Y are not subject to errors.

Using these differential signals N1X, N1Y, N2X, N2Y, one or more error signals may be calculated. The differential signals N1X, N1Y, N2X, and N2Y may be summed up in pairs resulting in error signals. Hence, an first error signal $$N1=N1X+N1Y=VXL-VYL+VXR-VYR=VXL-VYL+VXR-VYR$$

and/or a second error signal $$N2=N2X+N2Y=VXL-VYR+VXR-VYL=VXL-VYL+VXR-VYR$$

may be defined. As can be seen from the above equations for N1 and N2, the error signals N1 and N2 result in the same value:

$$N1=N2=N1X+N2X=N1Y+N2Y=VXL-VYL+VXR-VYR.$$

The error signals N1 and N2 may hence be used alternatively to each other. In some embodiments the error detector 540 may hence be configured to determine the error signal N1 (or N2) corresponding to a sum of a first differential signal N1X (or N2X) and a second differential signal N1Y (or N2Y). The first differential signal N1X (N2X) and, correspondingly, the second differential signal N1Y (N2Y) may each be indicative of a difference between one of the half bridge signals of the first full bridge 520 and one of the half bridge signals of the second full bridge 530. Some example combinations of the differences are the ones outlined above.

Moreover, it is also possible to add two half bridge signals provided by the same full bridge first, for example VXL+

VXR and VYL+VYR and then subtract VYL+VYR from VXL+VXR in order to obtain the error signal N1 or N2.

The aforementioned expression N1=N2=VXL−VYL+ VXR−VYR may also be written as $$N1=N2=(+1)*VXL+(-1)*VYL+(+1)*VXR+(-1)*VYR.$$

The error detector 540 may hence be configured to determine the error signal N1; N2 based on a weighted sum of the first, the second, the third and the fourth half bridge signal VXL; VXR; VYL; VYR. In some embodiments, weighting-coefficients of the weighted sum may be chosen from the set {−1; 1}. However, generally weighting-coefficients from the set {−n; n} are possible, wherein n may denote an arbitrary number. In some embodiments the error detector 540 may be configured to choose the weighting-coefficients such that the error signal corresponds to a sum of a first differential signal N1X (or N2X) and a second differential signal N1Y (N2Y). Thereby the first differential signal N1X (or N2X) may be indicative of a difference between the first half bridge signal VXL and the third half bridge signal VYL. The second differential signal N1Y (N2Y) may be indicative of a difference between the second half bridge signal VXR and the fourth half bridge signal VYR.

In the ideal case of error-free differential signals, the error signals N1 and N2 turn out to be zero. Zero may thus represents a reference value. A deviation of N1 and/or N2 from zero may indicate an error anywhere in a data path, beginning at the sensor elements (the XMR resistors XLU; XRU; XLD; XRD; YLU; YLD; YLD; YRD) themselves, which is analyzed more closely in the following.

Figure 9A:
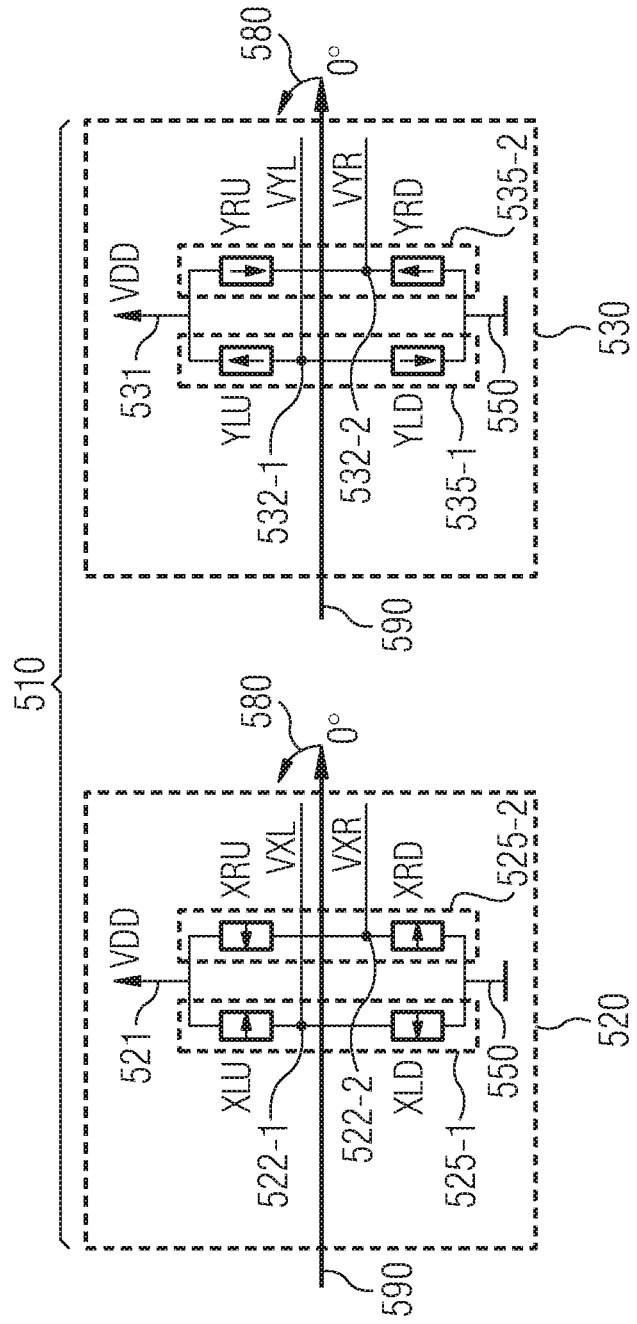
FIG. 9a illustrates an embodiment of two bridge circuits with respective magnetizations.

FIG. 9a illustrates an example implementation of the first full bridge 520 and the second full bridge 530 with their respective components similar to the implementation described with reference to FIG. 5b. The XMR resistors XLU; XRU; XLD; XRD of the first full bridge 520 in FIG. 9a however exhibit reference magnetizations which differ from those shown in FIG. 5b by 180°. As a result, the half bridge signals VXL and VXR provided by the left half bridge 525-1 and the right half bridge 525-2 are swapped with respect to their values. The differential signals N1X, N1Y, N2X, N2Y and the error signals N1, N2 may thus be adapted accordingly in order to perform the following analysis, though, qualitatively, this has no effect on the results of the further analysis.

Turning now to FIG. 9a, an orientation of an external magnetic field to be measured is indicated by arrows 590. A horizontal line running from left to right (or, in other words, parallel to the reference magnetizations of XMR resistors XLU and XRD in FIG. 9a) may define an angle of 0°. The external magnetic field 590 may rotate in the image plane of FIG. 9a, which is indicated by two curved arrows 580.

In the following an error of an XMR resistor is assumed. FIG. 9b displays two tables 910; 920 corresponding to the first full bridge 520 and the second full bridge 530, respectively. In some embodiments, signals (full bridge signals, half bridge signals, differential signals, error signals, etc.) may pass through an Analog-to-Digital Converter (ADC) coupled to or located in the error detector 540. Some embodiments comprising ADCs will be explained more thoroughly at a later point. In the example embodiment shown in FIGS. 9a and 9b, an ADC is used, for which a gain error value is given in the headline of the first table 910.

The gain error of an ADC or Digital-to-Analog Converter (DAC) indicates how well the slope of an actual transfer function matches the slope of the ideal transfer function. Gain error is usually expressed in Least Significant Bit (LSB) or as a percent of Full-Scale Range (% FSR), and it can be calibrated out with hardware or in software. Gain error is the full-scale error minus the offset error. For an ADC or DAC, the weight of an LSB equals the full-scale voltage range of the converter divided by 2N, where N is the converter's resolution. For example, for a 12-bit ADC with a unipolar full-scale voltage of 2.5V, 1LSB=(2.5V/$2^{12}$)=610 µV.

In the left column of the first table 910 global values are listed for a supply voltage applied to the supply ports 521; 531 of the full bridges 520; 530, respectively, and an operating temperature in ° C. The supply voltage value VDD in the example embodiment is 2.5V, and the temperature value is 25° C.

The first lines of each table 910; 920 list the four XMR resistors of the respective full bridges 520; 530. The second set of lines lists a base resistivity value of each XMR resistor, given in Ohm (Ω). In absence of errors, these values are 1000Ω for all eight XMR resistors. The third set of lines lists a sensitivity value of each XMR resistor, yielding an interval in % by which the resistivity value may alter when the orientation angle of the external magnetic field changes. For all eight sensors, alterations of up to 2% may be achieved in the absence of errors. The fourth set of lines lists an orientation of the reference magnetization in [°] with respect to the reference direction (0°) shown in FIG. 9a. Ideally, two diagonally opposite XMR sensors in a full bridge (for example XLU and XRD) have reference magnetizations parallel to each other, wherein another two diagonally opposite XMR sensors in the same full bridge (for example XLD and XRU) have reference magnetizations parallel to each other but antiparallel to the previous two XMR sensors. Ideally, the reference magnetizations occurring in XMR sensors of the first full bridge 520 are orthogonal to reference magnetizations occurring in the second full bridge 530 in the example embodiment. A reference magnetization error of 1° is assumed for the sensor element XLU, as can be seen from the table 910.

The values listed in the tables 920, 930 of FIG. 9b may serve as a basis for error checks, which may be a part of the error analysis in some embodiments. With reference to this basis, some embodiments may allow to detect an error in a base resistivity value, in sensitivity to changes in the quantity to be measured, or in an orientation of a reference direction of an XMR sensor. In other words, these errors in the signal path may occur based on a parameter deviation of a single sensing resistor.

The following illustrative error checks involve parameter deviations of the sensor element XLU. The parameters are altered one by one while the other parameters are kept at their ideal (error-free) value, and the respective effects will be visualized in FIGS. 10, 11 and 12.

Figure 10:
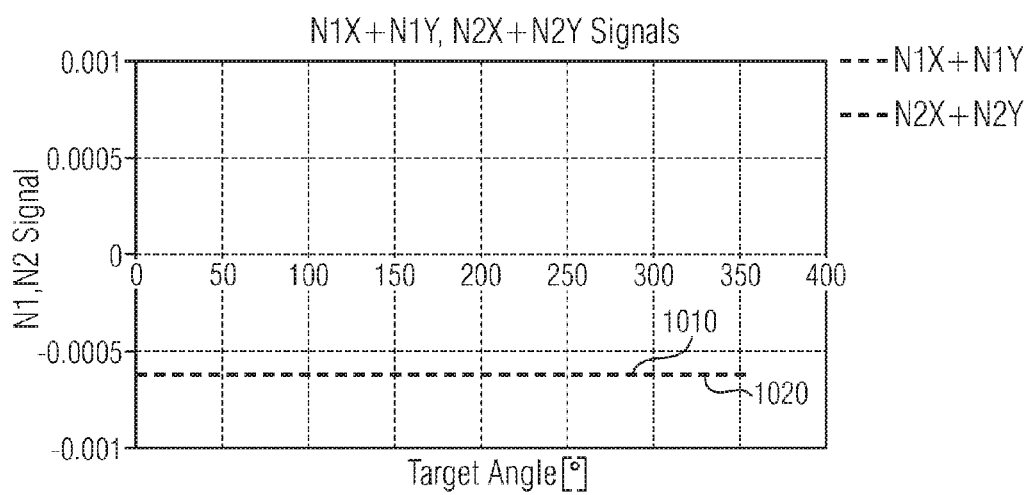
FIG. 10 depicts a diagram showing the behavior of a first error signals in dependence of an angle.

Firstly, a base resistivity value of sensor element XLU is assumed to have an offset from its nominal value by 0.1%. This leads to a shift of the half bridge signal VXL (and, consequently, the differential signals N1X, N2X and the error signals N1, N2) along the y-axis. The sign of the shift may depend on the sensor element subject to the deviation or error and the sign of the deviation itself. FIG. 10 shows a diagram where the signal strength in mV is plotted against the orientation angle (or "target angle") in [°]. As stated before, the error signals N1 and N2 are equal to each other, leading to an error graph 1010 for the signal N1 coinciding with an error graph 1020 for the signal N2. By changing the base resistivity value of the sensor element XLU by 0.1% and keeping the error-free values of FIG. 9b, the error signals N1; N2 are shifted by 625 µV from the reference value of 0V over the full angle range of 0°-360° in the given example. Hence, the same output voltage may be seen on N1 and N2, and said output voltage is constant over an angular range of 0°-360°. Or, more generally, a single XMR base resistor deviation may lead to an offset error. An offset error may in other embodiments also be triggered by an erroneous ADC, which the signal VXL (or N1X; N2X) has passed before.

In other words, the error detector 540 may in some embodiments be configured to indicate the error as a resistance offset of a resistive element included in the full bridge 520 (or 530) relative to a further resistive element included in the full bridge 520 (or 530). Said error may be indicated if the error signal N1 and/or N2 exceeds a predefined limit and is essentially constant over a measurement range. An error signal value may therein be directly proportional to the resistance offset.

An angular error, hence a deviation of a measured angle from an actual angle value, arising from the offset error may be determined based on the error signal N1; N2. Offset errors may be detected in the full 360° range based on N1 and N2. One possible decision criterion may be to check if N1 or N2 is not larger or smaller than a certain predefined limit. The offset may be the same, independently of the choice of N1=(N1X+N1Y) or N2=(N2X+N2Y) for measurement. A known relationship for the example embodiment is that 1% offset (related to Amplitude) results in 0.57° angular error.

Figure 11:
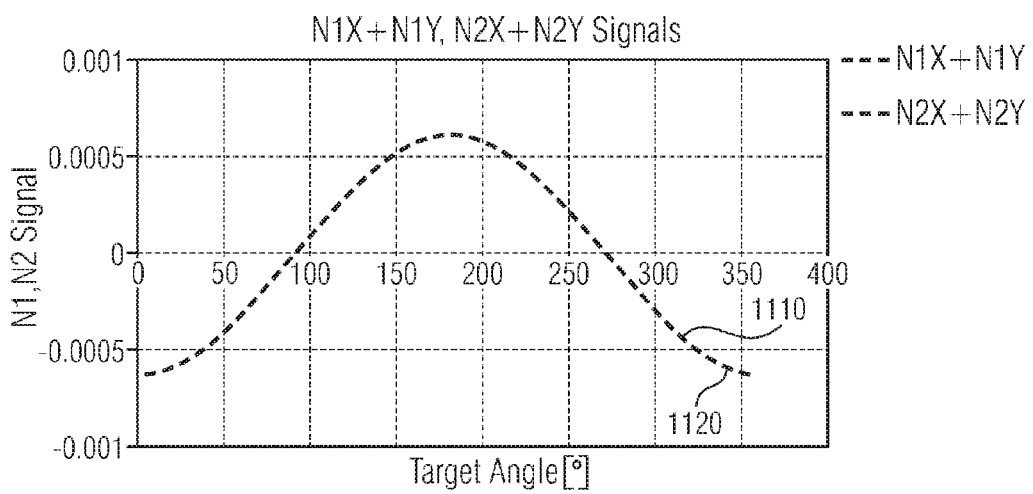
FIG. 11 depicts a diagram showing the behavior of a second error signals in dependence of an angle.

Next, the resistor sensitivity of the sensor element XLU is assumed to have an offset from its nominal sensitivity value by 5%. Thereby resistor sensitivity may be regarded as a measure how much a sensor element's resistivity changes in response to a predefined change of the physical quantity to be measured. The sensitivity offset leads to a change in amplitude of the half bridge signal VXL (and, consequently, an amplitude change in the differential signals N1X; N2X altering the error signals N1; N2). The sign of the shift may depend on the sensor element subject to the deviation or error and the sign of the deviation itself. FIG. 11 shows a diagram where the signal strength in mV is plotted against the orientation angle in °. Again, an error graph 1110 for the error signal N1 coincides with an error graph 1120 for the error signal N2. By changing the resistor sensitivity of the sensor element XLU by 5% and otherwise keeping the error-free values of FIG. 9b, the error signals N1; N2 show a cosine shape with an amplitude of +/−625 µV. Hence, the same output voltage may be seen on N1 and N2. The maxima and minima are reached at 0° and 180°. This type of error may also be referred to as s "sensitivity error", "amplitude error" or "synchronism error".

Hence, the error detector 540 may in some embodiments be configured to indicate the error as a deviation of a sensitivity of a resistive element included in the full bridge 520; 530 to a variation of the quantity from a further sensitivity of a further resistive element included in the full bridge 520; 530 to the variation of the quantity. Said error may be indicated if the error signal N1 (or N2) exceeds a predefined limit and if the differential signal N1X (or N2X) differs in an amplitude from the differential signal N1Y (or N2Y).

Furthermore, the error signal N1 (or N2) may in some embodiments indicate a deviation between resistive properties, in response to the measured physical quantity, of a resistive element of the first full bridge 520 and a corresponding resistive element of the second full bridge 530, for example XLU in the first full bridge 520 and YLU in the second full bridge 530. The error may be indicated if the error signal N1 (and/or N2) exceeds a predefined limit and if the differential signal N1X (and/or N2X) differs in amplitude or a phase from the differential signal N1Y (and/or N2Y), such that the error signal N1 (and/or N2) is of a positive or negative cosine shape. By said cosine shape, the synchronism error may be distinctively discerned.

An angular error resulting from the synchronism error may also be calculated from the error signal N1 (and/or N2). Synchronism errors may thus be detected in a more reliable range than with the vector length check (see FIGS. 3 and 4), because the angular error also occurs in that angle range where a deviation of the error signal N1 (and/or N2) from zero occurs. A decision criterion may be to check if N1 or N2 is not larger or smaller a certain predefined limit. The synchronism error may exhibit a relationship to N1 or N2. In the example embodiment 1.96% synchronism error corresponds to 1 mV in the error signal N1 or N2. A known relationship for the example embodiment is that 1% of synchronism error results in 0.29° measured angular error.

Figure 12:
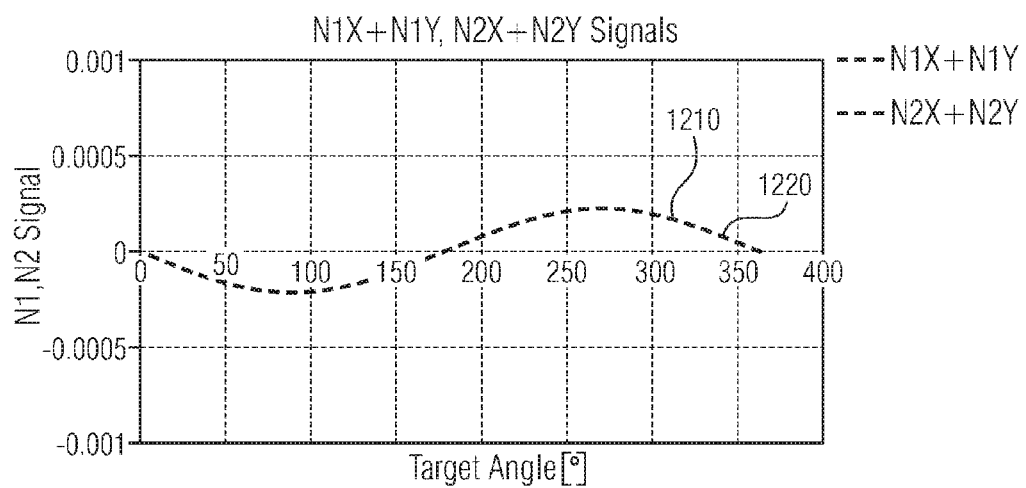
FIG. 12 depicts a diagram showing the behavior of a third error signals in dependence of an angle.

Next, the reference direction (which, in the example embodiment, is the reference magnetization) of the sensor element XLU is assumed to have an offset from its nominal value by 1°. This leads to a phase shift of the half bridge signal VXL (and, consequently, a phase shift in the differential signals N1X; N2X altering the error signals N1; N2) along the x-axis. The sign of the shift may depend on the sensor element subject to the deviation and the sign of the deviation itself. FIG. 12 illustrates a diagram where the signal strength in mV is plotted against the orientation angle in °. As is the case in FIGS. 10 and 11, an error graph 1210 for the signal N1 coincides with an error graph 1220 for the signal N2. By changing the reference direction of the sensor element XLU by 1° and otherwise keeping the error-free values of FIG. 9b, the error signals N1 and N2 show a sine shape with an amplitude of +/−220 µV. Hence, the same output voltage may be seen on N1 and N2, and minimum and maximum are reached at 90° and 270°. This type of error may also be referred to as a "phase error" or "orthogonality error".

The error detector 540 may thus in some embodiments be configured to indicate the error as a deviation of a first reference orientation of a first magneto-resistive element of the full bridge 520 (or 530) from a second reference orientation of a second magneto resistive element of the full bridge 520 (or 530). Said error may be indicated if the error signal N1 (or N2) exceeds a predefined limit, and if the differential signal N1X (or N2X) is phase-shifted against the differential signal N1Y (or N2Y), such that the error signal is of a positive or negative sine shape. By said sine shape, the orthogonality error may be distinctively discerned.

Again, an angular error resulting from the orthogonality error may be determined based on the error signal N1 or N2. Thus, orthogonality errors may be detected in a wider range than with the vector length check, because the angle error also occurs in that angle range where a deviation of N1 (or N2) from zero occurs. A decision criterion may be to check if N1 or N2 is not larger or smaller a certain predefined limit. In the example embodiment, the orthogonality error correlates to the error signal N1 or N2 such that 1.145° orthogonality error correspond to 1 mV in the error signal N1 or N2. A known relationship for the example embodiment is that 1° of orthogonality error results in 1° angular error.

In contrast to the vector length check (compare FIGS. 3 and 4), the analysis presented above may allow detection of a failure around the full range of 0°-360° in the case of an offset error. For amplitude and phase errors, the deviation from an ideal value of the error signal N1 or N2 may be at the same angle as the angular error occurs. For example, angular errors may be present only if the error signal N1 or N2 deviates from zero.

To summarize, the error detector 540 may be configured to indicate the error if the error signal N1 or N2 shows a signal variation around a mean value for at least two different orientations of the magnetic field with respect to a reference orientation.

In some embodiments the apparatus 500 may further be configured to provide a warning signal if the error signal N1 or N2 exceeds a predefined limit and is configured to deactivate itself or an associated circuit if the error signal exceeds a predefined further limit. This way security standards in the usage of the error detection apparatus 500 may be preserved, as a deactivation may in some cases be preferable to an unreliable result, which may occur if the error signal exceeds the further limit.

The apparatus 500 may in further embodiments comprise a processor. The processor may be configured to store a reference value and to perform a comparison of the reference value with a half bridge signal VXL; VXR; VYL; VYR, a differential signal N1X; N2X; N1Y; N2Y, or a full bridge signal X; Y. The error detector 540 may be configured to provide the error signal based on the comparison. In yet further embodiments, said signals may be stored themselves and be made available to a user. This may represent another way to constrain potential error sources. Furthermore, comparison to a reference value may unveil drift effects, for example through altering temperatures, aging, or magnetic field effects.

Figure 13:
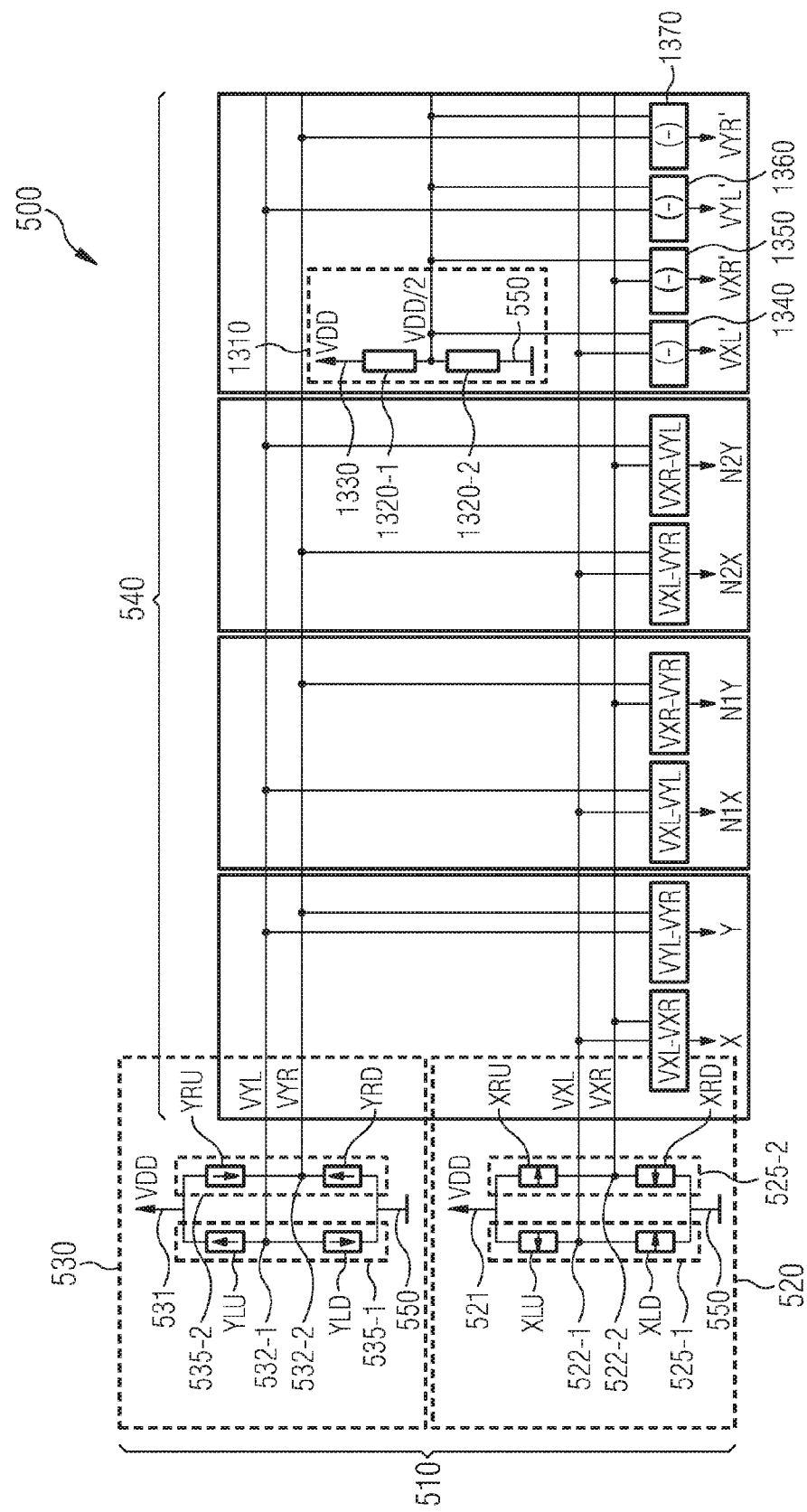
FIG. 13 illustrates a further embodiment of an XMR sensor and a respective circuit arrangement with different combinations of signals.

Moreover it may be possible in some embodiments to deliver raw half bridge values to an electronic control unit (ECU) associated with the apparatus 500 and to perform diagnostic functions on each half bridge signal. FIG. 13 shows how this may be implemented in a further example embodiment.

The full bridges 520, 530 and signals generated by these or by parts of the full bridges 520; 530 correspond to the example embodiment shown in FIG. 5b. The apparatus 500 further comprises an auxiliary circuit 1310. The auxiliary circuit 1310 may include two auxiliary resistors 1320-1; 1320-2 of equal resistivity in a serial connection. The serial connection of the two auxiliary resistors 1320-1; 1320-2 is coupled to a supply port 1330 and to ground 550 or a similar reference potential. A supply voltage VDD applied to the serial connection corresponds to the supply voltage for the first full bridge 520 and the second full bridge 530. Hence, a voltage VDD/2 may be sensed between the auxiliary resistors 1320-1; 1320-2. Auxiliary differential signals 1340, 1350, 1360, 1370 may be calculated from VDD/2 and the half bridge signals VXL; VXR; VYL; VYR. Thus, VDD/2 may serve as a reference voltage for the auxiliary differential signals 1340, 1350, 1360, and 1370. The apparatus 500 may hence comprise an auxiliary circuit 1310 configured to provide a reference voltage corresponding to a fraction of the nominal supply voltage VDD applied to the first bridge circuit 520 and the second bridge circuit 530 in some embodiments. The error detector 540 may be configured to generate a plurality of auxiliary differential signals 1340 (VXL'), 1350 (VXR'), 1360 (VYL'), 1370 (VYR') based on the reference voltage and the half-bridge signals VXL; VXR; VYL; VYR. In particular, a first auxiliary differential signal 1340 may be obtained from a difference between VXL and VDD/2. The auxiliary differential signal 1350 may be obtained from a difference between VXR and VDD/2. The auxiliary differential signal 1360 may be obtained from a difference between VYL and VDD/2. Likewise, the auxiliary differential signal 1370 may be obtained from a difference between VYR and VDD/2.

The auxiliary differential signals 1340, 1350, 1360, 1370 may also show sine and cosine behavior and auxiliary angle values may be calculated from them for comparisons, for example, from a combination of the auxiliary differential pairs (1340; 1360), (1340; 1370), (1350; 1360), or (1350; 1370). The auxiliary differential signals 1340, 1350, 1360, and 1370 may be read out by a microcontroller and used externally to recalculate the angles using different combinations of the auxiliary differential signals.

Furthermore, if an average value over the full angular range of an auxiliary differential signal deviates from VDD/2, deviations of the supply voltage from its nominal value may be detected. In other words, the auxiliary differential signals 1340, 1350, 1360, and 1370 may also be used as error signals, respectively. In this case the error signal may indicate a deviation between an actual supply voltage of the first measurement bridge circuit 520 and an actual supply voltage of the second measurement bridge circuit 530 if an auxiliary differential signal 1340, 1350, 1360, 1370 indicative of a difference between a half bridge signal and the reference voltage differs from the reference voltage.

Moreover, a differential ADC may be used in some embodiments, for example for converting one or more differential signals from analog to digital. Such a differential ADC may require a reference signal. This reference signal may be provided by a constant reference voltage such as VDD/2.

Some embodiments may incorporate additional ideas for data path supervision. Since the signals may pass one or several circuit components, such as multiplexers, ADCs or digital signal processors before a measurement result of the measured quantity is made available to a user, failures in these components may be detected by checking the performance to unveil possible failures in said components, which may result in angular errors.

Furthermore, circuit interruptions or short-circuits may occur and lead to errors. Both may manifest themselves in comparably high half bridge signals VXL, VXR, VYL, VYR. In other words, these signals may exceed one order of magnitude in comparison to their value in the error-free case in some embodiments, or in an overload of a used ADC.

An ADC may be used in combination with a multiplexer, such that the multiplexer switches between different half bridge or differential signals and provides these signals in individually allocated time slots to the ADC. However, conventional ADCs may require a given time span where oscillations may occur, until the ADC may correctly convert the current signal from analog to digital form. For this reason a successive approximation ADC (SAR-ADC) may be used, which may allow a faster switching process between signals.

In one embodiment, the SAR-ADC allows to switch and cross-check during operation if the sampling rate is chosen properly. Errors may hence for example arise if signals are provided to the ADC in a wrong time slot. Further, the multiplexer may switch between an actual signal and a reference value. This may enable a cross-check before signals are evaluated to yield a measurement result of the quantity.

In another embodiment, it may be possible to use two separate ADCs for the full bridge signals X; Y and the "safety functions" N1X, N1Y, N2X, N2Y, VXL, VXR, VYL, VYR, and/or the auxiliary differential signals VXL', VXR', VYL', VYR'. The apparatus 500 may in other words comprise a first analog-to-digital converter configured to receive a full bridge signal X; Y, and a second analog-to-digital converter configured to receive at least one of the group consisting of a half bridge signal VXL; VXR; VYL; VYR and a differential signal N1X; N1Y; N2X; N2Y.

In yet another embodiment it is possible to use two separate ADCs for the X and Y signals and one separate ADC for the safety functions N1X, N1Y, N2X, N2Y, VXL, VXR, VYL, VYR, and possibly the auxiliary differential signals. The apparatus 500 may in other words comprise a first analog-to-digital converter configured to receive a full bridge signal X indicative of a difference between the first and the second half bridge signal. The apparatus 500 may further comprise a second analog-to-digital converter configured to receive a full bridge signal Y indicative of a difference between the third and the fourth half bridge signal. Also, the apparatus may comprise a third analog-to-digital converter configured to receive a differential signal N1X; N2X or a second differential signal N1Y; N2Y.

In some embodiments auxiliary angle value may be calculated from the error or safety signals N1; N2; VXL, VXR, VYL, VYR, and/or the auxiliary differential signals VXL', VXR', VYL', VYR' for comparison with a master angle value, calculated from X and Y. Some examples are auxiliary angles resulting from a combination of the signal pairs (N1X; N2X), (N1Y; N2Y), (VXR; VYR), (VXL; VYL), (VXR; VYL), or (VXL; VYR).

Figure 14:
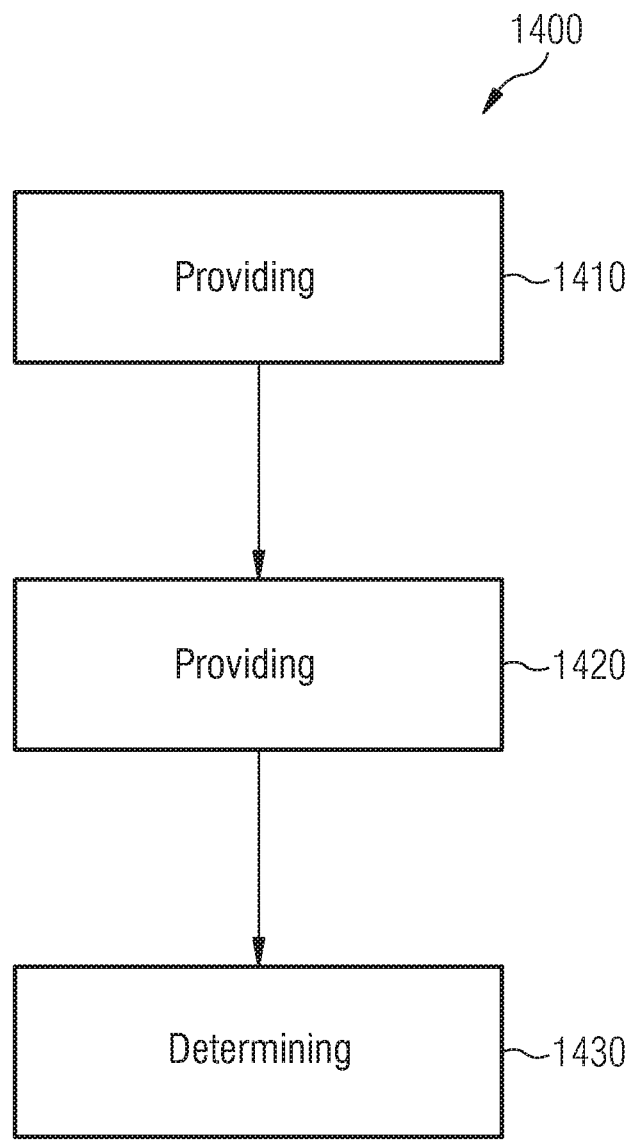
FIG. 14 depicts a flow chart of a method for detecting an error in the measurement of a quantity.

Turning now to FIG. 14, some embodiments also provide a method 1400 for detecting an error in a measurement of a physical quantity. The method 1400 comprises a providing 1410, from a first measurement bridge circuit 520 measuring the quantity, a first half bridge signal VXL and a second half bridge signal VXR. The method 1400 further comprises a providing 1420, from a second measurement bridge circuit 530 measuring the quantity, a third half bridge signal VYL and a fourth half bridge signal VYR. The method 1400 also comprises a determining 1430 of an error signal N1 or N2 indicative of the error based on a combination of the first, the second, the third and the fourth half bridge signal.

This way, already existent half bridge signals, which may be used for achieving a measurement result related to the quantity to be measured, may further serve to detect an error in the measurement of the physical quantity. In doing so, additional expenses and production steps, for example caused by additional hardware, may be avoided. Simultaneously the method 1400 may allow keeping safety standards for sensor apparatuses.

To summarize, one idea of embodiments is to use existing half bridge signals (or half bridge signals) to form new combinations of them generating differential signals, which may be used for safety checks. In these checks a detected deviation may result in a measurement error. Another idea is that different behavior of resistors in response to a change in the quantity to be measured may be detected with the error signal N1 or N2.

The description and drawings merely illustrate some aspects of the embodiments. It will thus be appreciated that those skilled in the art will be able to devise various arrangements that, although not explicitly described or shown herein, embody various aspects of embodiments and are included within its spirit and scope. Furthermore, all examples recited herein are principally intended expressly to be only for pedagogical purposes to aid the reader in understanding the principles of the invention and the concepts contributed by the inventor(s) to furthering the art, and are to be construed as being without limitation to such specifically recited examples and conditions. Moreover, all statements herein reciting principles, aspects, and embodiments of the invention, as well as specific examples thereof, are intended to encompass equivalents thereof.

Functional blocks (performing a certain function) shall be understood as functional blocks comprising circuitry that is adapted for performing a certain function, respectively.

It should be appreciated by those skilled in the art that any block diagrams herein represent conceptual views of illustrative circuitry embodying the principles of the invention. Similarly, it will be appreciated that any flow charts, flow diagrams, state transition diagrams, pseudo code, and the like represent various processes which may be substantially represented in computer readable medium and so executed by a computer or processor, whether or not such computer or processor is explicitly shown.

Furthermore, the following claims are hereby incorporated into the Detailed Description, where each claim may stand on its own as a separate embodiment. While each claim may stand on its own as a separate embodiment, it is to be noted that—although a dependent claim may refer in the claims to a specific combination with one or more other claims—other embodiments may also include a combination of the dependent claim with the subject matter of each other dependent claim. Such combinations are proposed herein unless it is stated that a specific combination is not intended. Furthermore, it is intended to include also features of a claim to any other independent claim even if this claim is not directly made dependent to the independent claim.

It is further to be noted that methods disclosed in the specification or in the claims may be implemented by a device having means for performing each of the respective steps of these methods.

Further, it is to be understood that the disclosure of multiple steps or functions disclosed in the specification or claims may not be construed as to be within the specific order. Therefore, the disclosure of multiple steps or functions will not limit these to a particular order unless such steps or functions are not interchangeable for technical reasons. Furthermore, in some embodiments a single step may include or may be broken into multiple sub steps. Such sub steps may be included and part of the disclosure of this single step unless explicitly excluded.

The invention claimed is:

1. An apparatus comprising:
a first measurement bridge circuit comprising a first half bridge to provide a first half bridge signal in response to a quantity to be measured and a second half bridge to provide a second half bridge signal in response to the quantity,
a second measurement bridge circuit comprising a third half bridge to provide a third half bridge signal in response to the quantity and a fourth half bridge to provide a fourth half bridge signal in response to the quantity, and
an error detector configured to determine an error signal indicative of an error of the measurement of the quantity based on a combination of the first, second, third and fourth half bridge signals,
wherein the combination includes one or more differential signals between a respective half bridge signal of the first measurement bridge circuit a respective half bridge signal of the second measurement bridge circuit.

2. The apparatus of claim 1, further comprising circuitry to provide at least two different combinations of the first, second, third and fourth half bridge signals to the error detector.

3. The apparatus of claim 2, wherein the at least two different combinations include a first combination of differential signals from a first group of differential signals and a second combination of differential signals from a second group of differential signals, wherein the first group of differential signals corresponds to a first selection of differential signals from the first, second, third and fourth half bridge signals and wherein the second group of differential signals corresponds to a second selection of differential signals from the first, second, third and fourth half bridge signals, wherein the first selection is different from the second selection.

4. The apparatus according to claim 3, wherein at least one of the first group of differential signals or second group of differential signals includes a differential signal formed from at least one of the first and second half bridge signals and at least one of the third and fourth half bridge signals.

5. The apparatus of claim 1, wherein the error detector is configured to determine the error signal based on a weighted sum of the first, the second, the third and the fourth half bridge signal.

6. The apparatus of claim 1, wherein the error detector is configured to determine the error signal corresponding to a sum of a first and a second differential signal,
wherein the first differential signal is indicative of a difference between the first half bridge signal and the third half bridge signal, and
wherein the second differential signal is indicative of a difference between the second half bridge signal and the fourth half bridge signal.

7. The apparatus of claim 6, wherein the first measurement bridge circuit and the second measurement bridge circuit are configured such that a phase difference between the first and the second differential signal is in range of 180°±10°.

8. The apparatus of claim 1, wherein one or more resistive elements of the first and the second measurement bridge circuit are magneto-resistive elements.

9. The apparatus of claim 1, wherein the first measurement bridge circuit and the second measurement bridge circuit are configured such that a phase difference between a first full bridge signal of the first measurement bridge circuit in response to the quantity and a second full bridge signal of the second measurement bridge circuit in response to the quantity is in range of 90°±10°.

10. The apparatus of claim 1, wherein the error detector is configured to compare the error signal against a predefined limit, and to indicate the error if the error signal exceeds the predefined limit.

11. The apparatus of claim 1, wherein the error detector is configured to indicate the error as a resistance offset of a resistive element included in the first measurement bridge circuit relative to a further resistive element included in the first measurement bridge circuit if the error signal exceeds a predefined limit and is essentially constant over a measurement range, wherein an error signal value is directly proportional to the resistance offset.

12. The apparatus of claim 1, wherein the error detector is configured to indicate the error as a deviation of
a sensitivity of a resistive element included in the first measurement bridge circuit to a variation of the quantity from a further sensitivity of a further resistive element included in the first measurement bridge circuit to a variation of the quantity,
if the error signal exceeds a predefined limit and if a first differential signal indicative of a difference between the first and the third half bridge signal differs in an amplitude from a second differential signal indicative of a difference between the second and the fourth half bridge signal.

13. The apparatus of claim 1, wherein the error signal indicates a deviation between resistive properties, in response to the measured quantity, of a resistive element of the first measurement bridge circuit and a corresponding resistive element of the second measurement bridge circuit, if the error signal exceeds a predefined limit and if a first differential signal indicative of a difference between the first and the third half bridge signal differs in an amplitude or a phase from a second differential signal indicative of a difference between the second and the fourth half bridge signal, such that the error signal is of a positive or negative cosine shape.

14. The apparatus of claim 1, wherein the apparatus is configured to provide a warning signal if the error signal exceeds a predefined limit and is configured to deactivate itself or an associated circuit if the error signal exceeds a predefined further limit.

15. The apparatus of claim 1, comprising:
a processor configured to store a reference value and to perform a comparison of the reference value with at least one of the group consisting of the first, the second, the third, and the fourth half bridge signal, a first differential signal indicative of a difference between the first and the third half bridge signal, a second differential signal indicative of a difference between the second and the fourth half bridge signal, a first full bridge signal, and a second full bridge signal,
wherein the error detector is configured to provide the error signal based on the comparison.

16. The apparatus of claim 1, comprising:
an auxiliary circuit configured to provide a reference voltage corresponding to a fraction of a nominal supply voltage applied to the first bridge circuit and the second bridge circuit, and
wherein the error detector is configured to generate a plurality of differential signals based on the reference voltage and the half-bridge signals.

17. The apparatus of claim 16, wherein the error signal indicates a deviation between an actual supply voltage of the first measurement bridge circuit and an actual supply voltage of the second measurement bridge circuit if a differential signal indicative of a difference between a half bridge signal and the reference voltage differs from the reference voltage.

18. The apparatus of claim 1, comprising:
a first analog-to-digital converter configured to receive a full bridge signal indicative of a difference between the first and the second half bridge signal or the third and the fourth half bridge signal, and
a second analog-to-digital converter configured to receive at least one of the group consisting of a half bridge signal, a first differential signal indicative of a difference between the first and the third half bridge signal, and a second differential signal indicative of a difference between the second and the fourth half bridge signal.

19. The apparatus of claim 1, comprising:
a first analog-to-digital converter configured to receive a full bridge signal indicative of a difference between the first and the second half bridge signal,
a second analog-to-digital converter configured to receive a full bridge signal indicative of a difference between the third and the fourth half bridge signal, and
a third analog-to-digital converter configured to receive a first differential signal indicative of a difference between the first and the third half bridge signal or a second differential signal indicative of a difference between the second and the fourth half bridge signal.

20. Apparatus for detecting an error in a measurement of a physical quantity, wherein the physical quantity is measured via a first Wheatstone bridge and a second Wheatstone bridge,
the first Wheatstone bridge comprising a first half bridge for providing a first half bridge signal response to the measured physical quantity and a second half bridge for providing a second half bridge signal response to the measured physical quantity,
the second Wheatstone bridge comprising a third half bridge for providing a third half bridge signal response to the measured physical quantity and a fourth half bridge for providing a fourth half bridge signal response to the measured physical quantity,
the apparatus comprising:
an error detector configured to determine the error based on a weighted sum of the first, the second, the third and the fourth half bridge signal.

21. The apparatus of claim 20, wherein the error detector is configured to choose weighting-coefficients such that the error signal corresponds to a sum of a first and a second differential signal,
wherein the first differential signal is indicative of a difference between the first half bridge signal and the third half bridge signal, and
wherein the second differential signal is indicative of a difference between the second half bridge signal and the fourth half bridge signal.

22. The apparatus of claim 20, wherein the first Wheatstone bridge comprises at least a first magneto-resistive element and wherein the second Wheatstone bridge comprises at least a second magneto-resistive element, wherein a reference orientation of the first magneto-resistive element is tilted against a reference orientation of the second magneto-resistive element by a tilt angle of essentially 90°.

23. The apparatus of claim 20, wherein the measured physical quantity is an angular orientation of a magnetic field, and wherein the error detector is configured to indicate the error if the error signal shows a signal variation around a mean value for at least two different orientations of the magnetic field with respect to a reference orientation.

24. The apparatus of claim 20, wherein the error detector is configured to indicate the error as a deviation of a first reference orientation of a first magneto-resistive element of the first Wheatstone bridge from a second reference orientation of a second magneto resistive element of the first Wheatstone bridge, if the error signal exceeds a predefined limit, and if a first differential signal indicative of a difference between the first and the third half bridge signal is phase-shifted against a second differential signal indicative of a difference between the second and the fourth half bridge signal.

25. A method for detecting an error in a measurement of a quantity, the method comprising:
providing, from a first measurement bridge circuit measuring the quantity, a first half bridge signal and a second half bridge signal;
providing, from a second measurement bridge circuit measuring the quantity, a third half bridge signal and a fourth half bridge signal; and
determining an error signal indicative of the error based on a combination of the first, the second, the third and the fourth half bridge signal,
wherein the combination includes one or more differential signals between a respective half bridge signal of the first measurement bridge circuit a respective half bridge signal of the second measurement bridge circuit.

* * * * *